United States Patent [19]

Suzuki et al.

[11] Patent Number: 4,663,649

[45] Date of Patent: May 5, 1987

[54] SIC SINTERED BODY HAVING METALLIZED LAYER AND PRODUCTION METHOD THEREOF

[75] Inventors: Hideo Suzuki, Katsuta; Satoshi Kokura, Hitachiohta; Osamu Asai; Kunio Miyazaki, both of Hitachi, all of Japan

[73] Assignee: Hitachi, Ltd., Tokyo, Japan

[21] Appl. No.: 504,787

[22] Filed: Jun. 16, 1983

[30] Foreign Application Priority Data

Jun. 16, 1982 [JP] Japan .............................. 57-102202

[51] Int. Cl.⁴ ..................... H01L 23/02; H01L 23/06; H01L 23/08; H01L 23/14
[52] U.S. Cl. ........................................ 357/67; 357/81; 357/80; 357/74
[58] Field of Search ............ 357/81, 80, 67, 74, 357/71, 65; 174/52 FP; 428/469, 470, 471, 472, 697, 698, 701; 148/DIG. 148; 427/82

[56] References Cited

U.S. PATENT DOCUMENTS

| | | | |
|---|---|---|---|
| 2,937,324 | 5/1960 | Kroko | 148/DIG. 148 |
| 3,121,829 | 2/1964 | Huizing et al. | 148/DIG. 148 |
| 3,201,666 | 8/1965 | Hall | 148/DIG. 148 |
| 4,352,120 | 9/1982 | Kurihara et al. | 357/81 |
| 4,517,584 | 5/1985 | Matsushita et al. | 357/74 |

FOREIGN PATENT DOCUMENTS 615175  2/1961  Canada ...................... 148/DIG. 148

Primary Examiner—Andrew J. James
Assistant Examiner—S. V. Clark
Attorney, Agent, or Firm—Antonelli, Terry & Wands

[57] ABSTRACT

A metallized layer formed on a SiC sintered body essentially consists of a metal conductor such as Cu or Au as its principal component and a binder such as phosphorous alloy, the oxide of which forms a vitreous material together with a silicon oxide formed previously on the surface of the SiC sintered body, the metallized layer is bonded to the SiC sintered body through a fused vitreous layer of a composite oxide formed during sintering of the metallized layer in an oxidizing atmosphere, the fused vitreous layer of the composite oxide essentially consists of the silicon oxide and the oxides of the binder.

The metallized layer exhibits an improved wettability to solders.

9 Claims, 6 Drawing Figures

SIC SINTERED BODY HAVING METALLIZED LAYER AND PRODUCTION METHOD THEREOF

BACKGROUND OF THE INVENTION

1. Field of the Invention:

This invention relates to a novel SiC sintered body having an electro-conductive thin layer is a metallized layer and method of producing the same.

2. Prior Art Techniques:

Metallization of a ceramic sintered body is one of the indispensable and important techniques for forming a conductor portion of a ceramic multilayered wiring board. The metallization methods include the methods of forming thin or thick films, electroless plating, and so forth.

As a method of metallizing an alumina ceramic sintered body, an ordinary method comprises coating a metallizing composition containing Mo powder and Mn powder on the surface of the sintered body, sintering the composition to form a metallized layer and thereafter effecting Ni plating, Cu plating and brazing.

Japanese Patent Laid-Open No. 77212/1978 discloses a method of forming a metal film to alumina and beryllia sintered bodies. This method comprises disposing a layer of granular metal powder on the surface of a ceramic substrate, exposing the layer to a binder at a high temperature so as to form an eutectic solution of the metal powder and the binder and directly bonding the metal powder to the substrate as the eutectic solution wets the metal powder and the substrate surface.

A problem of this method is that when applied as such to a non-oxide type ceramic sintered body, the method can not form a metal film having high bonding power to such a ceramic sintered body.

Japanese Patent Laid-Open No. 113683/1980 discloses a metallizing composition for a non-oxide type ceramic sintered body and metallization method. This composition consists of a metal having high wettability to silicon carbide and a metal having low thermal expansion coefficient and a high melting point. The reference also discloses a method which coats this composition in the paste form onto the sintered body and sinters the composition in a non-oxidizing atmosphere. However, this composition is not free from the problem that wettability to solder is low.

SUMMARY OF THE INVENTION

1. Object of the Invention:

The present invention is directed to provide an SiC sintered body having an electro-conductive thin layer as a metallized layer having high wettability to solder and high bonding power and method of producing the same.

The present invention is specifically directed to provide an SiC sintered body, for use in an electric or electronic appliance, having an electro-conductive thin layer as a metallized layer having high solder wettability and high bonding power to the SiC sintered body, which is dielectric at room temperature, the SiC sintered body of the present invention also having a heat transfer rate of at least 0.4 cal/cm·sec.°C. at room temperature and a thermal expansion coefficient of up to $4 \times 10^{-6}$/°C. at room temperature.

2. Explanation of the Invention:

A high density and electrically insulating sintered body of SiC as its principal component having an electro-conductive thin layer on a desired surface thereof, the present invention relates to an SiC sintered body having an electro-conductive thin layer as a metallized layer which is characterized in that the metallized layer contains at least one member selected from the group consisting of metals selected from the Groups Ib and VIII of the Periodic Table and their alloys and a binder, of which oxide forms a vitreous matter together with a silicon oxide formed previously on the SiC sintered body, and is bonded to the sintered body via a fused vitreous layer including the silicon oxide formed on the surface of the sintered body and oxides of the binder.

In the case of the W-Mo paste, for example, the bonding mechanism of the metallized layer to the oxide type ceramic sintered body is believed to be such that the glass component contained in the paste is fused and its fused matter and the sintered body react with each other, thus causing bonding. In the case of the non-oxide type ceramics such as the sintered body which consists of SiC as its principal component and in which the mutual reaction of the oxides is less, the fused glass in the paste does not easily react with the sintered body but causes a large number of bubbles. For this reason, bonding can not be made so simply. The inventors of the present invention have found that if the silicon oxide is formed on the surface of the SiC sintered body and if a binder in the paste for the metallized layer of which oxide is capable of being fused with the silicon oxide and forming a vitreous matter therewith is used, a fused layer is formed at the interface between the sintered body and the metallized layer and strong bonding therebetween can be realized.

3. Metallized layer:

At least one member selected from the group consisting of metals selected from the Groups Ib and VIII of the Periodic Table and their alloys are necessary in order to form a electrical conductor, a resistance or the like on the surface of the SiC sintered body. The metal or alloy which contributes to electrical conduction is preferably the principal component for the metallized layer and more preferably, the amount thereof is at least 80 wt% in the metallized layer. Examples of such elements are Au, Cu, Ag, Fe, Ni, Co, Pt, Rh, Ru, Pd, Os and Ir. Preferably, the metallized layer is up to 50 $\mu$m thick.

The electrical conductor for the metallized layer preferably consists of Au or Cu as its principal component. Preferably, a binder for Cu consists principally of a Cu-P alloy and a binder for Au consists principally of at least one of a B-P alloy, Bi and Ge.

Furthermore, it is preferred to use a binder consisting of at least one of B-P alloy, Bi and Ge and a small amount of Cu, for Au.

The metallized layer is preferably a sintered thin metal film consisting of Au as the principal component and contains a binder containing at least one member of 0.1 to 3 wt% of B-P alloy containing 40 to 60 wt% of P, 0.5 to 10 wt% of Bi and 0.1 to 5 wt% of Ge. Preferably, this metallized layer further contains 0.01 to 1 wt% of Cu.

The metallized layer is preferably a sintered thin metal film consisting of Cu as the principal component and contains 5 to 20 wt% of Cu-P alloy containing 5 to 20 wt% of P.

4. Fused vitreous Layer:

The metallized layer is firmly bonded to the SiC sintered body by the fused layer containing the oxides that form a vitreous matter. The thickness of the fused layer is controlled by the treating temperature and time but is preferably up to 5 μm in view of the heat transfer rate and conductivity. The fused layer is formed only at the interface between the SiC sintered body and the metallized layer and consists of a composite oxide of the silicon oxide formed previously on the surface of the SiC sintered body and at least one oxide of the binder in the paste for the metallized layer selected from the oxides of the group consisting of P, B, Bi, Zn, Sn, Sb, As, Ge and Te. Especially preferably, the fused layer is a fused vitreous matter in order to obtain high bonding power.

5. SiC Sintered Body:

A preferred sintered body consists principally of SiC and has a heat transfer rate of 0.4 cal/cm·sec.°C. at room temperature and a thermal expansion coefficient of up to $4 \times 10^{-6}$/°C. This sintered body can be obtained by sintering a mixture consisting of at least 90 wt% of SiC and containing at least one of Be, Be compounds and BN to a density at least 90% of the theoretical density. The resulting sintered body has specific resistance of at least $10^7$ ohm·cm at room temperature. This sintered body preferably consists of 0.1 to 5 wt% of at least one of Be, beryllium oxide and beryllium carbide, 0.4 wt% of free carbon, 0.1 wt% of Al, 0.1 wt% of B and the balance being substantially SiC.

6. Production Method:

In a method of forming an metallized layer on a desired surface of a high density sintered body consisting of SiC as its principal component, the present invention provides a method of producing an SiC sintered body having an electro-conductive thin layer as a metallized layer which method comprises disposing a mixture containing at least one member selected from the group consisting of metal powders selected from the Groups Ib and VIII of the Periodic Table and their alloys, and a binder of which oxide forms glass together with a silicon oxide previously formed, on a desired surface of the SiC sintered body; heating the mixture in an oxidizing atmosphere in which an oxide of the binder is formed; and fusing the silicon oxide on the surface of the SiC sintered body and the oxide of the binder, thereby forming a fused vitreous layer of the oxides at the interface between the sintered body and the metallized layer and thus bonding the metallized layer to the sintered body.

7. Oxidizing Atmosphere:

The oxidizing atmosphere preferably contains at least one of oxygen and moisture to such an extent that the metal or the alloy powder in the metallized layer components is not oxidized at the sintering temperature. Especially those metals which are not oxidized by heating in the air, such as Au, Pt, Ag and the like, are preferably heated in the air. If heating is carried out in the air, it is preferred to feed fresh air into a furnace during heating.

In the case of those metal powders which are oxidized in the air, such as Cu, Ni and the like, they are preferably heated in an oxidizing atmosphere which does not oxidize the powder of these metals. Especially when the Cu powder is employed, heating is preferably carried out in the inert gas which is passed through water for humidification.

8. Heating:

Heat-sintering is preferably carried out at a temperature lower than the melting points of the metal powder or of the alloy powder but is higher than the temperature at which the binder in the paste for the metallized layer is alloyed and fused with the metal powder or with the alloy powder, or higher than the melting point of the binder. If the sintered body coated with a paste containing an organic matter is charged into and is rapidly heated in a furnace at the sintering temperature, the coating would peel so that the heating is preferably carried out gradually or the temperature is raised to the sintering temperature after heating is once effected around 100° C. to evaporate the organic matter. A preferred temperature is from 700° to 1,050° C. for Cu and from 700° to 1,000° C. for Au.

It is preferred that the sintered body be subjected to oxidizing treatment in advance to form the silicon oxide on the surface of the sintered body before the mixture is disposed. The oxidizing treatment is preferably carried out in the air at a temperature of 500° to 800° C.

9. Metal Powder and Alloy Powder:

The finer the metal and alloy powder forming the metallized layer component, the better, and their average particle size is especially preferably below 5 μm.

10. Binder, one of the components in the metallized layer:

Unless the oxides of the binder can form the vitreous matter together with the silicon oxide formed on the SiC sintered body, strong bonding of the metallized layer can not be obtained. Examples of the elements forming the vitreous matter upon being fused with the silicon oxide include P, B, Bi, Zn, Sn, As, Sb, Ge Pb, S and Al. At least one of these elements and their alloys is preferred as the binder. When the binder is heated in the oxidizing atmosphere, its oxide is formed and the oxide of the binder forms a composite oxide together with the silicon oxide formed on the surface of the SiC sintered body. The fused layer which is believed to be vitreous is formed only at the interface between the sintered body and the metallized layer and strongly bonds the metallized layer to the SiC sintered body. These binders do not deteriorate the wettability of the metallized layer to solder.

The binder is preferably used in the powder form. From 0.01 to 30 wt% of the binder is preferably mixed in the metal or alloy powder forming the principal component of the metallized layer. It is specifically preferred to add an organic matter to this mixed powder to form a paste or slurry-like paste. The binder in the powder form preferably has a particle size smaller than the average particle sizes of the metal or alloy powder.

11. Paste:

The paste is prepared by adding an organic matter to the mixture containing at least one member selected from the group consisting of metal powder selected from the Groups Ib and VIII of the Periodic Table and their alloys for electrical conduction and the binder for forming the vitreous matter with the silicon oxide, in the paste form.

The paste can be coated on a desired surface of the sintered body by screen printing, brushing, brush band, spray or dipping.

Examples of the organic matter are ethyl cellulose, nitrocellulose, acrylic resin and the like that are diluted by a solvent such as carbitol acetate, butyl carbitol, terpineol, and the like. When the mixture is used in the paste form, 10 to 50 wt% of organic matter is added to the mixed powder after it is diluted 5 to 30 times by the solvent.

When used as the paste, the binder preferably consists of the aforementioned P alloy, which has a melting point lower than the melting points of the metals and the alloys thereof which contribute to electrical conduction in the metallized layer. It is believed possible to use at least one of P alloys with Pb, Pr, Pt, Ru, Re, Rh, Pd, Sn, Sb, Ta, Te, Th, Ti, V, W, Zn, Zr, Mo, Nb, Ni, Bi, Cd, Co, Ce, Cr, Cu, Fe, Ge, In, Ga, Mg, Mn, Al and B.

Especially when a paste, which contains the Au powder, 0.1 to 3 wt% of the (B-P) alloy powder, 0.1 to 5 wt% of Ge powder and 0.5 to 10 wt% of Bi powder in addition to the organic matter described above, is sintered in the air, bonding power to the SiC sintered body is high and direct bondability to an Si semiconductor element is also high. The B-P alloy is preferably alloy powder containing 40 to 60 wt% of P.

A paste, which contains Cu powder, 5 to 20 wt% by Cu-P alloy powder containing 5 to 20 wt% of P and the organic matter described above provides high bondability to the SiC sintered body and high wettability of the metallized layer to solder when it is sintered in a humidified inert gas.

12. Application Examples of the Present Invention:

The present invention can be applied to an electric device wherein the metallized layer, containing at least one member selected from the group consisting of metals selected from the Groups Ib and VIII of the Periodic Table and their alloys and the binder of which oxide forms the vitreous matter together with the silicon oxide, is formed on a desired surface of the substrate using a sintered body consisting principally of SiC, circuit elements are disposed on the metallized layer and the metallized layer is bonded to the sintered body by the fused vitreous layer consisting of the silicon oxide previously formed on the surface of the sintered body and the oxides of the binder.

The circuit elements described above consist of capacitors soldered to the metallized layer as the conductor and semiconductor elements and the like that are bonded to the metallized layer as the conductor as a result of their direct reaction with the metallized layer and the silicon semiconductor.

If the binder for Au consists of the BP alloy and at least one member of Bi and Ge, the semiconductor elements consisting of Si can be directly and strongly bonded to the metallized layer.

If the substrate consisting of the high density sintered body composed principally of SiC contains 0.1 to 5 wt% of Be, Be oxides and Be carbides with the rest being substantially SiC and sintered to at least 90% of the theoretical density is employed, the substrate has specific resistance of at least $10^7$ Ohm·cm at room temperature, a heat transfer rate of at least 0.4 cal/cm·sec.°C. at room temperature and a thermal expansion coefficient of up to $4 \times 10^{-6}$/°C. Hence, an electric device having a high heat radiating capacity can be obtained.

If the metallized layer as the electrode is disposed on the surface of the sintered body containing at least one of Be and Be compounds in the manner described above, it can be used as a non-linear resistance having a current density of up to $10^{-9}$ A/cm$^2$ at an electric field of 1,000 V/cm at room temperature and a thermistor having a thermistor constant of 10,000 to 16,000 at 500° to 700° C.

13. Others:

Other metallic layers such as Ni plating, Cu plating, solder, and the like can be further formed on the metallized layer of the present invention, whenever necessary.

The metallized layer of the present invention can further contain at least one member selected from the group consisting of metals selected from the Groups IVa, Va, VIa and VIIa of the Periodic Table and their alloys. The amount of these metals is preferably up to 5 wt% in the metallized layer because they reduce wettability of the metallized layer to solder. These metals and their alloys are preferably added in the powder form to the paste described previously.

14. Effect of the Invention:

As described in the foregoing, the present invention can provide the SiC sintered body having the metallized layer which has a high bondability to the SiC sintered body and a high wettability to solder. Furthermore, the present invention can provide a semiconductor device by use of the SiC sintered body having the metallized layer of the present invention, which device has a high heat radiation, is free from peel of the metallized layer during use of the device and has high reliability.

EXAMPLE 1

Figure 1:
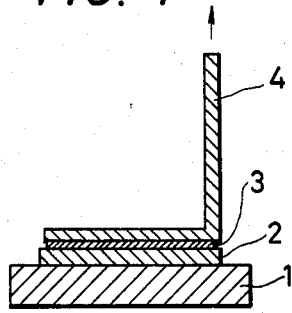
FIG. 1 is a sectional view of the test piece and is useful for explaining the peel test method of the metallized layer.

20 wt% of a butyl carbitol solution containing 6 vol% of ethyl cellulose was added to mixed powder consisting of each powder shown in Tables 1 and 2 and Cu powder to form a slurry and then a paste. The Cu powder had an average particle diameter of 5 μm and the metal and alloy powder of the binder had an average particle diameter of 2 to 3 μm. The Cu-P alloys used were a Cu-P alloy containing 14 wt% of P, a Fe-P alloy containing 25 wt% of P and a Ni-P alloy containing 14 wt%.

The SiC sintered body was produced in accordance with the following method. 2 wt% of beryllium oxide having a particle diameter of up to 10 μm was added to and mixed with the SiC powder having a particle diameter of 2 μm. A silicone resin diluted by xylene was added to and mixed with this mixed powder. The mixed powder was molded at room temperature and a pressure of 1,000 Kg/cm$^2$ to obtain a molded article. The molded article thus obtained was placed in a graphite die and was hot-pressed in a reducing atmosphere. The sintering pressure was 300 Kg/cm$^2$, the sintering temperature was maximum 2,050° C. and the retention time was 1 hour. The resulting sintered body had a density which was at least 98% of the theoretical density, a heat transfer rate of 0.6 cal/cm·sec.°C. at room temperature and specific resistance of at least $10^{12}$ Ohm·cm at room temperature.

The SiC powder used contained 17 ppm of B, 17 ppm of Mg, 87 ppm of Al, 51 ppm of Ca, 1,290 ppm of Ti, 540 ppm of V, 150 ppm of Cr, 7 ppm of Mn, 650 ppm of Fe, 11 ppm of Co, 240 ppm of Ni, 1 ppm of Zn, 90 ppm of Na, 0.57 wt% of free Si, 0.08 wt% of free C and 1.4 wt% of SiO$_2$. In the resulting sintered body, free Si and SiO$_2$ are charged to SiC through reaction with free C.

The surface coarseness of this sintered body was made to ±3 μm and after the surface was cleaned by degreasing and the like, the paste described above was printed on the surface by screen printing and was held for 15 minutes in each atmosphere and at each temperature for sintering. Before sintering, the substrate with the printed paste was held at 100° C. for 10 minutes to dry the paste.

The bonding power of the resulting metallized layer was determined in accordance with the method shown in FIG. 1. The metallized layer having a length of 2 mm, a width of 3 mm and a thickness of about 20 μm was disposed on the surface of the sintered body 1 and a 0.5 mm-thick copper foil 4 was bonded onto the layer 2 by a solder 3 consisting of 2% of Ag, 62.5% of Sn, 35.2% of Pb and 0.3% of Sb in terms of weight. The tensile strength (Kg/mm$^2$) when the foil 4 was pulled in the vertical direction indicated by an arrow in the drawing was determined. Further, the solder wettability test was conducted by dipping the sintered substrate described above into a solder bath for 2 to 3 seconds. The wettability was evaluated by three stages: mark ○ represents the testpieces having an excellent solder deposition area, Δ does the testpieces having a fair solder deposition area and X does the testpieces having an extremely small solder deposition area. In these tables, "Bond" represents bondability. The bondability was evaluated by scratching the metallized layer after sintering by pincettes to examine the state of peel. Mark ○ represents the testpieces having extremely high bondability, Δ does the testpieces having fair bondability and X does the testpieces having extremely low bondability. The term "Wet" represents the wettability to the solder described above. Samples Nos. 1 through 30 are samples of the present invention and samples Nos. 31 and 32 are comparative samples.

Sintering in the Ar and $N_2$ atmospheres was effected by causing the gas to flow through the furnace to substitute the air by these gas and then raising the temperature to a predetermined temperature. The air was substituted substantially completely by the Ar gas. In the case of the $N_2$ gas, however, it was believed that considerably good bondability could be obtained because substitution was not effected sufficiently, judging from the bondability illustrated in the tables.

TABLE 1

| | Binder | | $N_2 + H_2O$ | | | | | | |
|---|---|---|---|---|---|---|---|---|---|
| | | | 900° C. | | 950° C. | | 1,000° C. | 1,030° C. | |
| No. | wt % | Composition | Bond | Wet | Bond | Wet | Strength | Wet | Bond | Wet |
| 1 | 5 | Cu—P | ○ | ○ | | | 1.8 | ○ | ○ | ○ |
| 2 | 10 | Cu—P | ○ | ○ | | | 2.0 | ○ | ○ | ○ |
| 3 | 20 | Cu—P | ○ | ○ | | | 2.1 | ○ | ○ | ○ |
| 4 | 5 | Fe—P | ○ | ○ | | | 2.0 | ○ | ○ | ○ |
| 5 | 10 | Fe—P | ○ | ○ | ○ | ○ | 2.2 | ○ | ○ | ○ |
| 6 | 20 | Fe—P | ○ | Δ | | | 2.5 | ○ | Δ | Δ |
| 7 | 5 | Ni—P | ○ | ○ | | | 1.3 | ○ | ○ | Δ |
| 8 | 10 | Ni—P | Δ | ○ | ○ | ○ | 1.4 | Δ | ○ | ○ |
| 9 | 20 | Ni—P | | | | | 1.4 | Δ | | |
| 10 | 1 | P | | | | | 1.2 | ○ | | |
| 11 | 5 | P | | | | | 1.2 | Δ | | |

TABLE 2

| | Binder | | Ar | | $N_2$ | | | | $N_2 + O_2$ | | | | $N_2 + H_2O$ | | | | | |
|---|---|---|---|---|---|---|---|---|---|---|---|---|---|---|---|---|---|---|
| | | Composi- | 900° C. | | 600° C. | | 800° C. | | 850° C. | | 950° C. | | 900° C. | | 950° C. | | 1,030° C. | |
| No. | wt % | tion | Bond | Wet | Bond | Wet | Bond | Wet | Bond | Wet | Bond | Wet | Bond | Wet | Bond | Wet | Bond | Wet |
| 12 | 5 | Te | X | — | | | | | ○ | ○ | ○ | ○ | | | ○ | Δ | ○ | ○ |
| 13 | 10 | Te | | | Δ | ○ | Δ | ○ | | | | | | | Δ | ○ | ○ | ○ |
| 14 | 20 | Te | X | — | | | | | ○ | ○ | ○ | ○ | | | Δ | Δ | ○ | ○ |
| 15 | 5 | Al | X | — | | | | | | | ○ | ○ | | | ○ | Δ | ○ | ○ |
| 16 | 10 | Al | X | — | Δ | ○ | ○ | ○ | | | | | | | | | | |
| 17 | 20 | Al | | | | | | | ○ | ○ | | | Δ | ○ | ○ | ○ | ○ | ○ |
| 18 | 5 | Bi | X | — | | | | | ○ | Δ | | | | | ○ | ○ | ○ | ○ |
| 19 | 10 | Bi | | | Δ | ○ | ○ | ○ | | | | | | | | | | |
| 20 | 20 | Bi | X | — | | | | | ○ | Δ | | | | | | | | |
| 21 | 5 | Sb | X | — | | | | | ○ | Δ | | | | | ○ | Δ | | |
| 22 | 10 | Sb | X | — | | | | | | | | | | | ○ | Δ | | |
| 23 | 20 | Sb | X | — | | | | | | | | | | | ○ | Δ | | |
| 24 | 5 | Sn | X | — | | | | | | | ○ | ○ | ○ | | ○ | ○ | | |
| 25 | 10 | Sn | X | — | | | | | | | ○ | ○ | ○ | | | | | |
| 26 | 5 | Zn | X | — | | | | | ○ | ○ | ○ | ○ | ○ | Δ | ○ | ○ | ○ | ○ |
| 27 | 10 | Zn | X | — | | | | | ○ | ○ | ○ | ○ | ○ | ○ | ○ | ○ | ○ | ○ |
| 28 | 10 | S | | | | | | | | | | | | | ○ | ○ | | |
| 29 | 10 | Fe—S | | | | | | | | | | | | | ○ | Δ | | |
| 30 | 10 | B | | | | | ○ | Δ | | | | | ○ | Δ | | | | |
| 31 | 10 | Ti | | | | | | | | | | | | | ○ | X | ○ | X |
| 32 | 10 | Fe | | | | | | | | | | | | | ○ | X | ○ | X |

As shown in the tables, sintering by use of the Ar gas provided low bondability because the vitreous matter was not formed due to no oxide formation of the binder.

The $N_2+O_2$ atmosphere consisted of a mixed gas of $N_2$ and $O_2$ in a volume rate of 4:1 to substitute the air. Depending upon the kind and amount of addition of the binders, bondability and wettability to solder dropped in some cases but the paste of the present invention had good bondability as well as good wettability to solder.

The $N_2+H_2O$ atmosphere consisted of the $N_2$ gas (humidified $N_2$ gas) at room temperature which was passed through the water at room temperature to substitute the air. Sintering in this humidified $N_2$ atmosphere provided more excellent bondability and solder wettability than the other atmospheres. Especially, the testpiece using the Cu-P alloy powder exhibited the highest bondability and solder wettability. However, the comparative samples using the Ti and Fe binders exhibited low solder wettability. The Fe-P alloy exhibited ferro magnetic property and was unsuitable for a semiconductor device.

Incidentally, it was confirmed that the metallized layer having higher bondability could be maintained by dipping the samples into the solder for only a limited period of time because the SiC sintered body had a high heat transfer rate. The metallized layers of the present invention all had metal luster.

Figure 2:
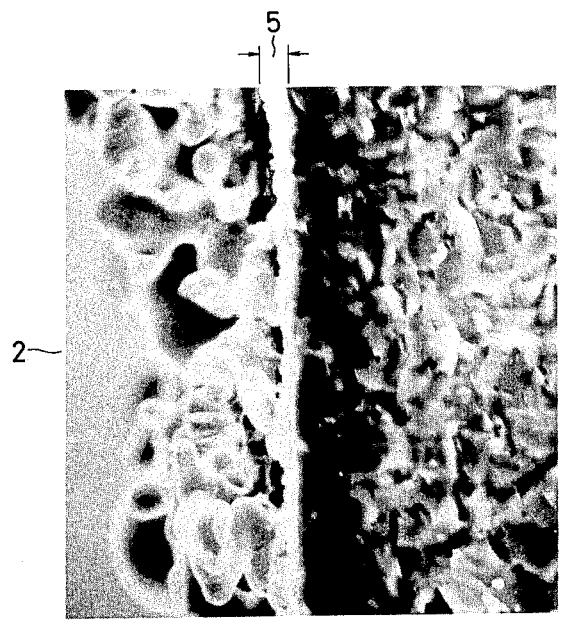
FIG. 2 is a micrograph showing the section of the SiC sintered body having the metallized layer of the present invention.

FIG. 2 is a scanning type electron micrograph (1,000 X) of the sections of the metallized layer and SiC sintered body which was sintered at 1,000° C. in the $N_2 + H_2O$ atmosphere using No. 1 paste. As shown in the photograph, it was confirmed that an about 3 $\mu$m intermediate layer 5 was formed between the metallized layer, Cu film 2 and the sintered body 1. As a result of the X-ray analysis of Si, P, Cu and O, this intermediate layer was confirmed to be a fused layer consisting of their oxides.

EXAMPLE 2

A paste was prepared in the same way as in Example 1 except that Au powder (average particle diameter = 2 $\mu$m) was used in place of Cu powder. The paste was coated and sintered on the SiC substrate shown in Example 1 at various temperatures while blowing the air into the furnace with the exception that samples Nos. 33 through 37 and 47 shown in Table 3 were sintered in the humidified $N_2$ in the same way as in Examples 1. Table 3 illustrates the compositions of binders and the bondability after sintering which was evaluated in the same way as in Example 1. Symbols ⊚ represents the testpieces having especially excellent bondability. Incidentally, the SiC substrate was heated at 600° C. for 2 hours in the air to form an oxide film on its surface before the paste was coated. The B-P alloy was 50 wt % B-P alloy and the Cu-P alloy had the same composition as that of Example 1. Samples Nos. 33 through 43 and 47 are samples of the present invention and samples Nos. 44 through 46 were comparative samples.

As shown in the table, in the case of the Au paste, the paste with the binder, the B, P, B-P alloys, the Cu-P alloy and the alloys containing Bi and Ge of the present invention, of which oxides reacted with the silicon oxide formed on the substrate surface and formed the vitreous matter with the a low melting point and exhibited high bondability in the air but the Au paste with the Al, Mg, and Ti binders could not form the low melting point vitreous matter with the silicon oxide of the substrate even when they were sintered in the air so that high bondability could not be obtained. The metallized layers of the present invention all had beautiful surfaces having metal luster.

The samples Nos. 33 through 37 and No. 44, that were sintered in the $N_2 + H_2O$ atmosphere, had considerably low bondability marked by Δ. In the case of the Au paste, bondability of the metallized layer became higher when sintering was made in the air.

When sintering was effected in the non-circulating atmospheres of the air and of $N_2 + H_2O$, bondability was not sufficient.

Especially when the binders used the B-P alloy, the Cu-P alloy, Ge and Bi, bondability was extremely high. A few micron thick fused layer was formed at the interface between the metallized layer and the sintered body in all cases.

It was further confirmed that when an Si semiconductor element was directly bonded to these metallized layers, high bondability could be obtained. Especially the metallized layer using Ge provided high bondability. This bonding method comprised placing the Si semiconductor element on the metallized layer formed on the substrate, placing the assembly on a heater, heating it to about 430° C., blowing the $N_2$ gas heated to about 300° C. onto the substrate for sealing while pushing the Si semiconductor element to the substrate in that atmosphere.

TABLE 3

| No. | Binder (wt %) | Sintering temperature (°C.) | | | | | |
|---|---|---|---|---|---|---|---|
| | | 600 | 800 | 900 | 950 | 970 | 1000 |
| 33 | 0.5B | — | — | ○ | ○ | — | — |
| 34 | 1B | — | — | Δ | Δ | — | — |
| 35 | 0.5B—0.5P | — | — | ○ | ○ | — | — |
| 36 | 1B—1P | — | — | ○ | Δ | — | — |
| 37 | 2BP | — | ○ | ○ | ○ | ○ | ○ |
| 38 | 1CuP | X | ○ | ⊚ | ⊚ | — | — |
| 39 | 5Bi | — | ⊚ | ⊚ | ⊚ | — | — |
| 40 | 1Ge | X | Δ | ⊚ | — | — | — |
| 41 | 1BP—0.3Ge—0.1Cu | — | ○ | ⊚ | ⊚ | ⊚ | ○ |
| 42 | 0.5Bi—0.3Ge—0.1Cu | — | ○ | ⊚ | ⊚ | ⊚ | ○ |
| 43 | 1Bi—0.3Ge—0.1Cu | — | ○ | ⊚ | ⊚ | ⊚ | ○ |
| 44 | 5Al | X | X | — | — | — | — |
| 45 | 2Mg | — | X | — | — | — | — |
| 46 | 2Ti | — | X | — | — | — | X |
| 47 | 1Ti—1Al—1Bi—1Ge—1BP | — | — | Δ | ○ | — | — |

EXAMPLE 3

Next, application examples of the present invention, applied to a semiconductor device using electrically insulating SiC sintered body having the metallized layer of the present invention as the substrate, will be illustrated.

Figure 3:
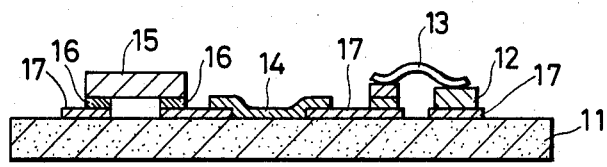
FIGS. 3 through 6 are sectional views of various semiconductor devices to which the SiC sintered body having the metallized layer of the present invention are applied.

FIG. 3 is a sectional view of an ignitor module. This semiconductor device was produced by first forming a metallized layer a thick film conductor 17. This conductor 17 was formed on the substrate 11 using the electrically insulating SiC sintered body of Example 1 by use of a paste consisting of the same Cu powder as that of Example 1 and 10 wt% of Cu-P alloy (containing 14 wt% of P) and sintering the substrate at 1,000° C. in the humidified $N_2$ which was the same as that of Example 1. A capacitor 15 was bonded to this conductor 17 by a solder 16 and an Si semiconductor element 12 was directly bonded to this thick film conductor 17. Reference numeral 14 represents a thick film resistance and reference numeral 13 represents a bonding wire. Au, Pd, Cu and Al are suitable as the bonding wire. An extremely thin wire having a diameter of about 20 to 70 μm is used as the bonding wire.

Figure 4:
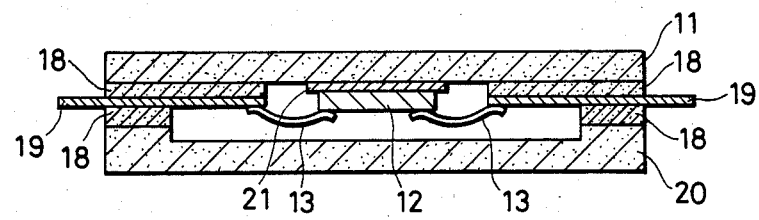

FIG. 4 is a sectional view of a logic LSI package not having a heat radiation fin. In the same way as described above, the paste No. 40 through 43 described in Example 2 was placed on the SiC sintered body as the substrate 11 and was sintered at 1,000° C., thereby forming a metallized layer, a thick film conductor 21. The Si semiconductor element was directly bonded onto the conductor in the same way as in Example 2. A lead frame 19 as the external lead, the substrate 11 and a cap 20 were bonded and sealed using ordinary glass 18. An $Al_2O_3$ sintered body was used as the cap.

Figure 5:
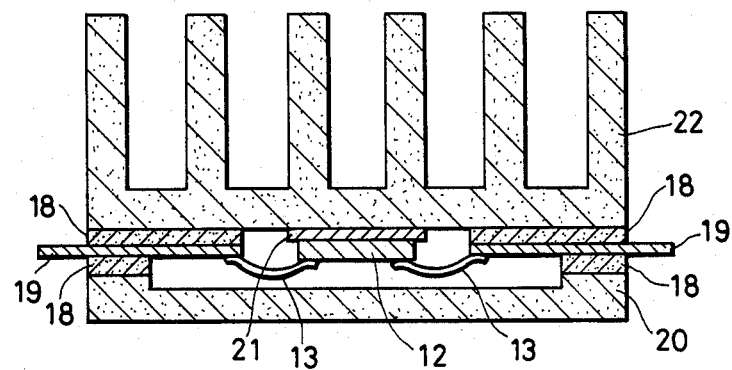

FIG. 5 is a sectional view of a logic LSI package equipped with a heat radiation fin 22 consisting of the electrically insulating sintered body.

The thick film conductor 21, which had the same composition as that of the thick film conductor 21 of FIG. 4, was disposed on the heat radiation fin 22 consisting of the SiC sintered body described in Example 1 and the Si semiconductor element 12 was directly bonded thereon in the same way as in Example 2. The lead frame 19 as the external lead, the heat radiation fin 22 and the cap 20 were sealed by the ordinary glass 18. An $Al_2O_3$ sintered body and Au, Pd, Cu and Al were suitable for the cap 20 and for the bonding wire, respectively.

Figure 6:
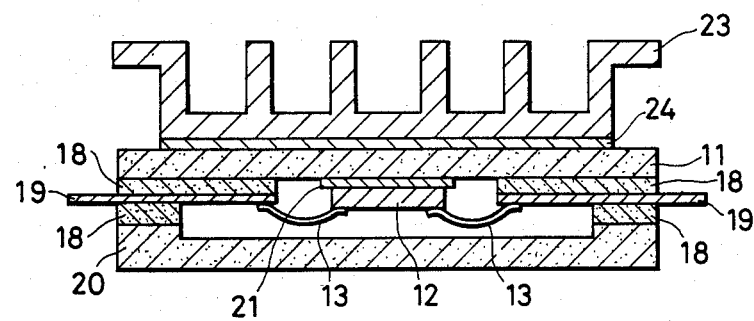

FIG. 6 is a sectional view of a logic LSI package equipped with the heat radiation fin 23 made of Al. This heat radiation fin 23 is the same as that of FIG. 4 except that it was bonded to the SiC sintered body as the substrate 11 by a resin 24.

A high temperature thermistor having a thermistor constant of 10,000 to 16,000 in the temperature range of 500° to 700° C. can be obtained by cutting the SiC sintered body of Example 1 in a suitable size and coating and sintering the paste of the present invention selected from those described in Examples 1 and 2 to form an electrode. Furthermore, a non-linear resistance having a current density of $10^{-9}$ A/cm$^2$ at room temperature and in an electric field of 1,000 V/cm can be obtained.

Although the sintered body having the metallized layer of the present invention has been described with reference to the thick film conductor, it is obvious that a thick film resistance can be naturally formed in the same way by selecting suitable metal or alloy powder as the principal component of the paste.

What is claimed is:

1. A SiC sintered body having a metallized layer formed on a desired surface of the SiC sintered body characterized in that said metallized layer contains 70–99.99 wt% of a metal conductor, and 0.01–30 wt% of a binder, of which oxide forms a vitreous matter together with a silicon oxide formed previously on the surface of said SiC sintered body, said metal conductor is at least one member selected from the group consisting of Au, Cu, Ag, Fe, Ni, Co, Pt, Rh, Ru, Pd, Os and Ir and alloys thereof and said binder is at least one member selected from the group consisting of P, B, Bi, Zn, Pb, As, Sb, Ge, Te and Sn, and alloys thereof, and further said metallized layer is bonded to said SiC sintered body through a fused vitreous layer of a composite oxide formed during sintering of said metallized layer in an oxidizing atmosphere, said fused vitreous layer of the composite oxide consists essentially of the silicon oxide and the oxide of said binder.

2. The SiC sintered body having a metallized layer as defined in claim 1, wherein said binder is at least one phosphorous alloy selected from the group consisting of a phosphorous alloy with Pb, Pr, Pt, Ru, Re, Rh, Pd, Sn, Sb, Ta, Te, Th, Ti, V, W, Zn, Zr, Mo, Nb, Ni, Bi, Cd, Co, Ce, Cr, Cu, Fe, Ge, In, Ga, Mg, Mn, Al or B.

3. The SiC sintered body having a metallized layer as defined in claim 1 wherein said fused vitreous layer is up to 5 μm thick.

4. The SiC sintered body having a metallized layer as defined in claim 1 wherein said metallized layer consists of said metal conductor of Cu as the principal component and 5 to 20 wt% of said binder of Cu-P alloy containing 5 to 20 wt% of P.

5. The SiC sintered body having a metallized layer as defined in claim 1 wherein said metallized layer consists of said metal conductor of Au as the principal component and at least one of said binders of 0.1 to 0.3 wt% of B-P alloy containing 40 to 60 wt% of P, 0.5 to 10 wt% of Bi and 0.1 to 5 wt% of Ge.

6. The SiC sintered body having a metallized layer as defined in claim 1 wherein said metallized layer consists of said metal conductor of Au as the principal component and, at least one of said binders of 0.1 to 3 wt% B-P alloy containing 40 to 60 wt% of P, 0.5 to 10 wt% of Bi and 0.1 to 5 wt% of Ge and 0.01 to 1 wt% of Cu.

7. The SiC sintered body having a metallized layer as defined in claim 1 wherein said sintered body consists of SiC as its principal component and has a heat transfer rate of at least 0.4 cal/cm·sec.°C. at room temperature and a heat expansion coefficient of up to $4 \times 10^{-6}$/°C. at room temperature.

8. The SiC sintered body having a metallized layer as defined in claim 1 wherein said sintered body contains at least one of Be, Be compounds and BN, contains SiC of at least 90 wt%, has a density of at least 90% of the theoretical density and is an electrically insulating substance having specific resistance of at least $10^7$ Ohm·cm at room temperature.

9. The SiC sintered body having a metallized layer as defined in claim 1 wherein said sintered body contains 0.1 to 5 wt% of at least one of Be, beryllium oxide and beryllium carbide, up to 0.4 wt% of free carbon, up to 0.1 wt% of aluminum and up to 0.1 wt% of B with the rest being substantially SiC and is an electrically insulating substance having specific resistance of at least $10^7$ Ohm·cm at room temperature.

* * * * *